US009967995B2

United States Patent
Molnar et al.

(10) Patent No.: US 9,967,995 B2
(45) Date of Patent: May 8, 2018

(54) SINGLE ACTION DIN RAIL LATCH

(71) Applicant: Rockwell Automation Technologies, Inc., Mayfield Heights, OH (US)

(72) Inventors: Nathan J. Molnar, Shaker Heights, OH (US); Yogesh Bhat, Mayfield Heights, OH (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 0 days. days.

(21) Appl. No.: 15/336,227

(22) Filed: Oct. 27, 2016

(65) Prior Publication Data

US 2017/0049001 A1 Feb. 16, 2017

Related U.S. Application Data

(63) Continuation of application No. 14/640,537, filed on Mar. 6, 2015, now Pat. No. 9,485,879.

(51) Int. Cl.
*H05K 5/00* (2006.01)
*H05K 5/02* (2006.01)
(Continued)

(52) U.S. Cl.
CPC ......... *H05K 7/1474* (2013.01); *H05K 5/0017* (2013.01); *H05K 5/0026* (2013.01); *H05K 5/0221* (2013.01); *H02B 1/0523* (2013.01)

(58) Field of Classification Search
CPC ... H01R 9/26; H01R 4/24; H01R 4/66; H01R 4/64; H01R 25/14; H01R 9/2608; H01R 25/142; H02B 1/052; H02B 1/0523
See application file for complete search history.

(56) References Cited

U.S. PATENT DOCUMENTS 5,362,259 A * 11/1994 Bolliger ............... H01R 9/2691
439/532
5,392,196 A * 2/1995 Kinner .................. H02B 1/052
174/17 R
(Continued)

FOREIGN PATENT DOCUMENTS

EP 0 437 124 A1 7/1991
WO WO 2013/054873 A1 4/2013

OTHER PUBLICATIONS

Beckhoff Fieldbus Components—Documentation for Terminal Modules (KM10X2), Ver. 2.0.0 dated Mar. 21, 2012 (3 pages).
(Continued)

*Primary Examiner* — Xanthia C Cunningham
(74) *Attorney, Agent, or Firm* — Fay Sharpe LLP

(57) ABSTRACT

An electronics module includes a latch with a first latch portion and a second latch portion. The latch portions move between a latched position and an unlatched position. A spring is located between the first and second latch portions and biases the first and second latch portions in first and second directions. The first latch portion comprises an actuation portion located externally from the housing and that is adapted to be manually engaged and moved linearly in the second direction to move the first latch portion from its latched position toward its unlatched position. The second latch portion includes a resilient tail with a locator tab that seats in either a first receiving location or a second receiving location of the first latch portion and that is selectively deflectable to disengage the locator tab from the second receiving location so that the spring moves the latch to the latched configuration.

17 Claims, 9 Drawing Sheets

(51) Int. Cl.
*H05K 7/14* (2006.01)
*H02B 1/052* (2006.01)

(56) References Cited

U.S. PATENT DOCUMENTS

| | | | |
|---|---|---|---|
| 5,904,592 A | 5/1999 | Baran et al. | |
| 6,224,429 B1* | 5/2001 | Bernhards | H01R 9/2608 439/709 |
| 6,418,027 B1 | 7/2002 | Suzuki et al. | |
| 6,431,909 B1 | 8/2002 | Nolden et al. | |
| 6,454,614 B1* | 9/2002 | Bechaz | H02B 1/052 439/532 |
| 7,059,898 B2 | 6/2006 | Barile | |
| 7,980,891 B2 | 7/2011 | Molnar | |
| 8,066,239 B2 | 11/2011 | Molnar et al. | |
| 2002/0037670 A1* | 3/2002 | Wilmes | H01R 4/2433 439/709 |
| 2002/0072256 A1* | 6/2002 | Lostoski | H01R 9/26 439/76.1 |
| 2002/0136599 A1* | 9/2002 | Comtois | H02B 1/052 403/362 |
| 2004/0043671 A1* | 3/2004 | Brasse | H01R 9/26 439/716 |
| 2008/0108248 A1* | 5/2008 | Lim | H02B 1/052 439/532 |
| 2008/0186657 A1* | 8/2008 | Weber | H02B 1/052 361/673 |
| 2008/0299820 A1* | 12/2008 | Schelonka | H01R 9/2608 439/532 |
| 2009/0125156 A1 | 5/2009 | Killian et al. | |
| 2010/0255713 A1* | 10/2010 | Peng | H02B 1/052 439/532 |
| 2010/0320342 A1* | 12/2010 | Moore | H05K 5/0204 248/226.11 |
| 2011/0261549 A1* | 10/2011 | Chao | H02B 1/052 361/814 |
| 2012/0028483 A1* | 2/2012 | Gassaur | H01R 4/4872 439/116 |
| 2012/0138759 A1* | 6/2012 | Takaya | H02B 1/052 248/225.21 |
| 2012/0264339 A1* | 10/2012 | Brand | H01R 4/4827 439/733.1 |
| 2012/0298490 A1* | 11/2012 | Buttner | H02B 1/052 200/303 |
| 2013/0214109 A1* | 8/2013 | Yu | H02B 1/0526 248/298.1 |
| 2013/0216304 A1* | 8/2013 | Schumacher | H01R 9/2608 403/376 |
| 2014/0017917 A1 | 1/2014 | Molnar | |
| 2014/0139976 A1* | 5/2014 | Santoni | F16B 1/00 361/605 |
| 2014/0226287 A1* | 8/2014 | V | H02B 1/052 361/747 |
| 2014/0357117 A1* | 12/2014 | Deshpande | H02B 1/052 439/532 |

OTHER PUBLICATIONS

Beckhoff Fieldbus Components—Documentation for Terminal Modules (KM10X4 / KM10X8), Ver. 2.0.0 dated Mar. 21, 2012 (3 pages).
X20 System User's Manual (B & R), Ver. 3.00 dated Oct. 2014, pp. 62, 2326-2328.
Extended European Search Report dated Jun. 6, 2016 for Application No. EP 16 15 8875.

* cited by examiner

SINGLE ACTION DIN RAIL LATCH

CROSS REFERENCE TO RELATED APPLICATION

This application is a continuation of U.S. application Ser. No. 14/640,537 filed Mar. 6, 2015, and the entire disclosure of said prior application is hereby expressly incorporated by reference into the present specification.

FIELD

The present development relates to an improved latch for an electronics module, and to an electronics module including the improved latch. In one application, the electronics module is an input/output (i/o) module or a controller module or the like provided as part of an industrial automation control system, but other types of electronics modules are contemplated and are within the scope of the present development. In one application, the latch is particularly adapted to selectively and releasably mate with a 35 mm×7.5 mm top hat DIN rail, i.e., a rail provided in accordance with EN 50022, BS 5584, DIN 46277-3 (referred to herein as a "DIN rail"), but the latch can be alternatively configured to mate with any other rail or structure including first and second edges or flanges to be engaged be the latch.

BACKGROUND INFORMATION

The subject matter disclosed herein relates to Industrial automation and other types of electronics modules often include a latch or latch system for selectively and releasably connecting the electronics module to an associated mounting structure such as a DIN rail. While known latches of this type are generally suitable and effective, a need has been identified for a new and improved latch assembly or latching system that is more convenient and effective than known latch assemblies.

SUMMARY

In accordance with one aspect of the present development, an electronics module includes a housing with a rear face comprising a recess adapted to receive an associated mounting rail. The recess comprises first and second opposite edges. A latch assembly is connected to the housing and is adapted for selectively releasably securing the housing an associated mounting rail located in the recess. The latch assembly comprises: a first latch portion movably connected to the housing and comprising a locking tab adapted to capture a first associated DIN rail flange in said recess; a second latch portion movably connected to the housing adjacent the first latch portion and comprising a second locking tab adapted to capture a second associated DIN rail flange in the recess. The first and second latch portions are movable relative to each other to and between: (i) a latched configuration where the first and second latch portions are located in respective latched positions in which the first and second locking tabs project respectively beyond the first and second opposite edges of the recess and partially obstruct the recess; and (ii) an unlatched configuration where the first and second latch portions are located in respective unlatched positions in which the first and second locking tabs are spaced farther apart from each other as compared to the latched configuration. The latch assembly further includes first and second springs, wherein the first spring exerts a biasing force on said first latch portion that urges both the first and second latch portions in a first direction relative to the housing when the first and second latch portions are located in the unlatched configuration, and wherein the second spring exerts a biasing force that urges said first latch portion in said first direction and urges said second latch portion in a second direction that is opposite said first direction.

In accordance with another aspect of the present development, an electronics module comprises a housing including a rear face comprising a recess comprising first and second opposite edges and an inner region. A latch assembly is connected to the housing and is adapted for selectively releasably securing the housing an associated mounting rail located in the recess. The latch assembly comprises: a first latch portion movably connected to the housing and comprising a locking tab adapted to capture a first flange of the associated mounting rail in said recess; and a second latch portion movably connected to the housing and slidably abutted with the first latch portion. The second latch portion comprises a second locking tab adapted to capture a second flange of the associated mounting rail in the recess. The first and second latch portions movable relative to each other to and between: (i) a latched configuration of the latch assembly in which the first and second latch portions are located in respective latched positions and the first and second locking tabs are spaced apart from each other by a first distance Y1 and project respectively beyond the first and second opposite edges of said recess and partially obstruct the recess; and (ii) an unlatched configuration of the latch assembly in which the first and second latch portions are located in respective unlatched positions and the first and second locking tabs are spaced apart from each other by a second distance Y2, wherein Y2>Y1. The electronics module includes first and second springs. The first spring is operatively located between the housing and the latch assembly and biases the first latch portion in a first direction when the latch assembly is arranged in the unlatched configuration. The second spring is operatively located between the first and second latch portions and biases the first latch portion in the first direction and biases the second latch portion in a second direction opposite the first direction. The first latch portion includes an actuation portion that projects and is located externally from the housing and that is adapted to be manually engaged and moved linearly to move the first latch portion from its latched position toward its unlatched position.

In accordance with a further aspect of the present development, an electronics module includes a housing with a rear face comprising a recess with first and second opposite edges and an inner region. A latch assembly is connected to the housing and is adapted for selectively releasably securing the housing to an associated mounting rail located in the recess. The latch assembly comprises: a first latch portion comprising a locking tab adapted to capture a first flange of the associated mounting rail in the recess; and a second latch portion slidably abutted with the first latch portion, the second latch portion comprising a second locking tab adapted to capture a second flange of the associated mounting rail in the recess. The first and second latch portions are movable relative to each other between: (i) a latched configuration of the latch assembly in which the first and second latch portions are located in respective latched positions and the first and second locking tabs are spaced apart from each other by a first distance Y1 and project respectively beyond said first and second opposite edges of said recess and partially obstruct said recess; and (ii) an unlatched configuration of the latch assembly in which the first and second latch portions are located in respective unlatched positions and the first and second locking tabs are spaced apart from each other by a second distance Y2, wherein Y2>Y1. A spring is operatively located between the first and second latch portions and biases the first latch portion in a first direction and biases the second latch portion in a second direction opposite the first direction. The first latch portion comprises an actuation portion located externally from the housing and that is adapted to be manually engaged and moved linearly in the second direction to move the first latch portion from its latched position toward its unlatched position.

DETAILED DESCRIPTION

Figure 1:
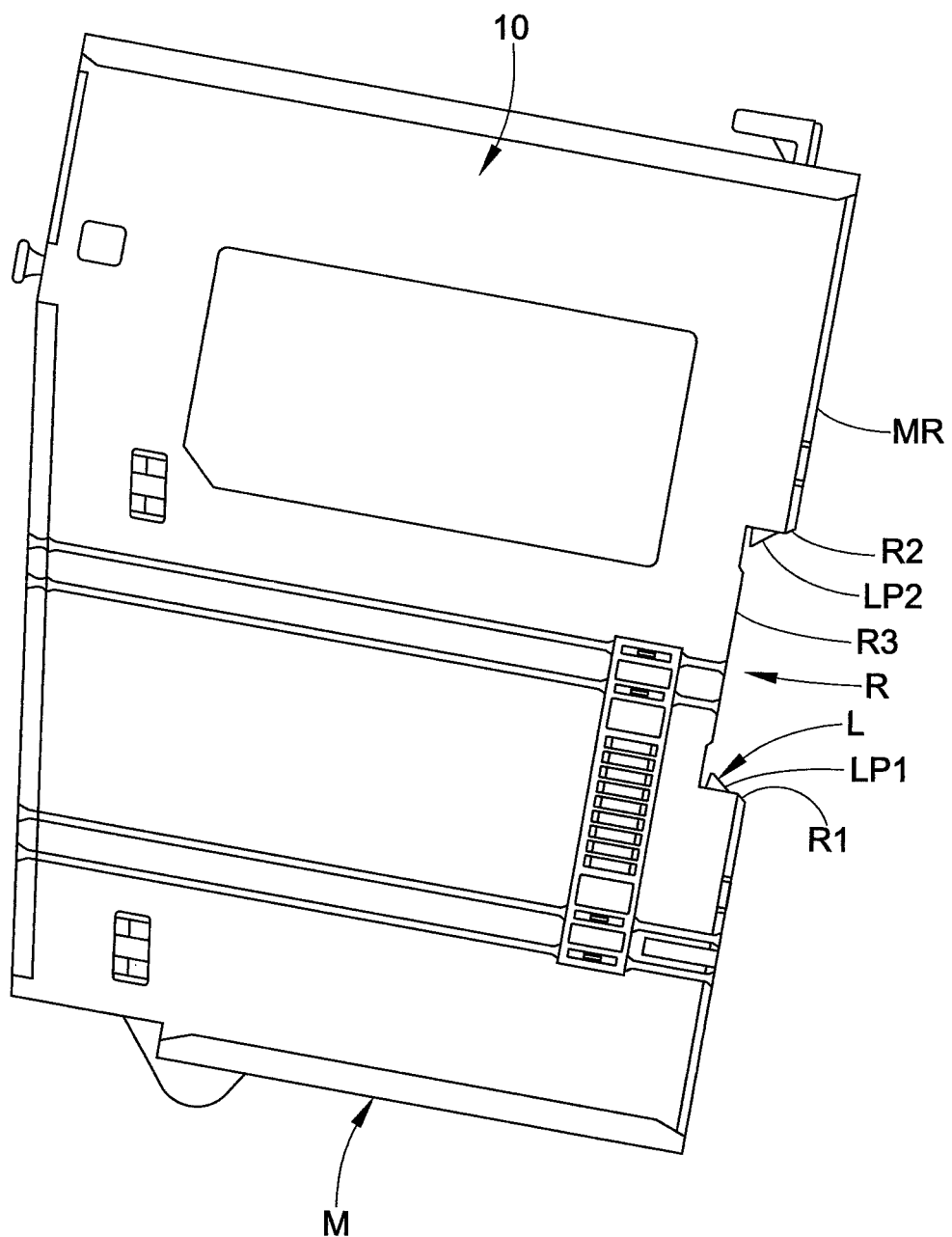
FIG. 1 is a side view of an electronics module including a latch system in accordance with an embodiment of the present development.
Figure 2:
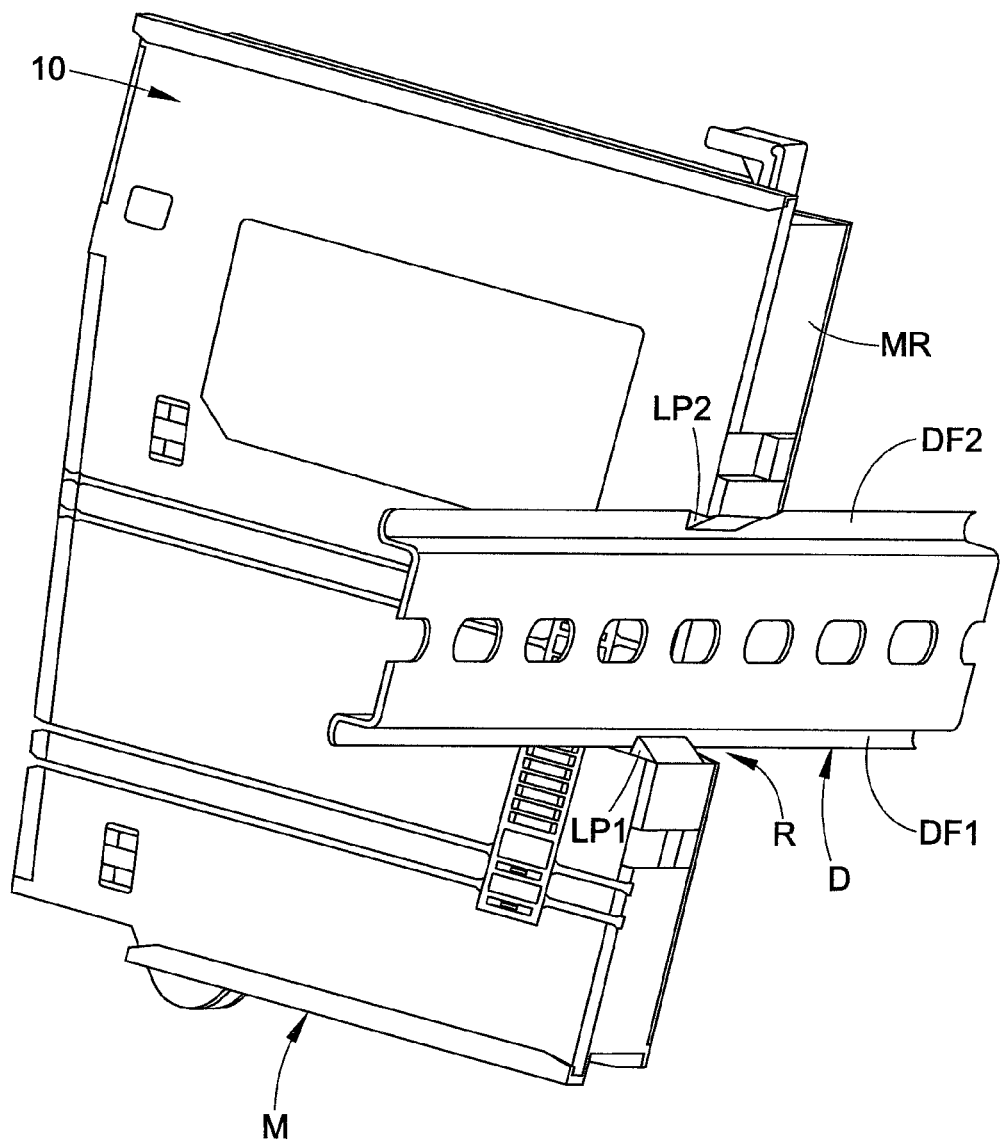
FIG. 2 is a rear isometric view of the electronics module of FIG. 1, showing the module operatively connected to an associated DIN rail.

FIG. 1 is a side view of an electronics module M including a latch system L in accordance with an embodiment of the present development. FIG. 2 is a rear isometric view of the electronics module M, showing the module operatively connected to an associated DIN rail D. The illustrated electronics module M is an input/output module of an industrial automation system, but the module can be any other type of electronics modules such as an adapter module, controller module, or another type of module of an industrial automation system, or an electronics module not related to an industrial automation system.

Figure 3:
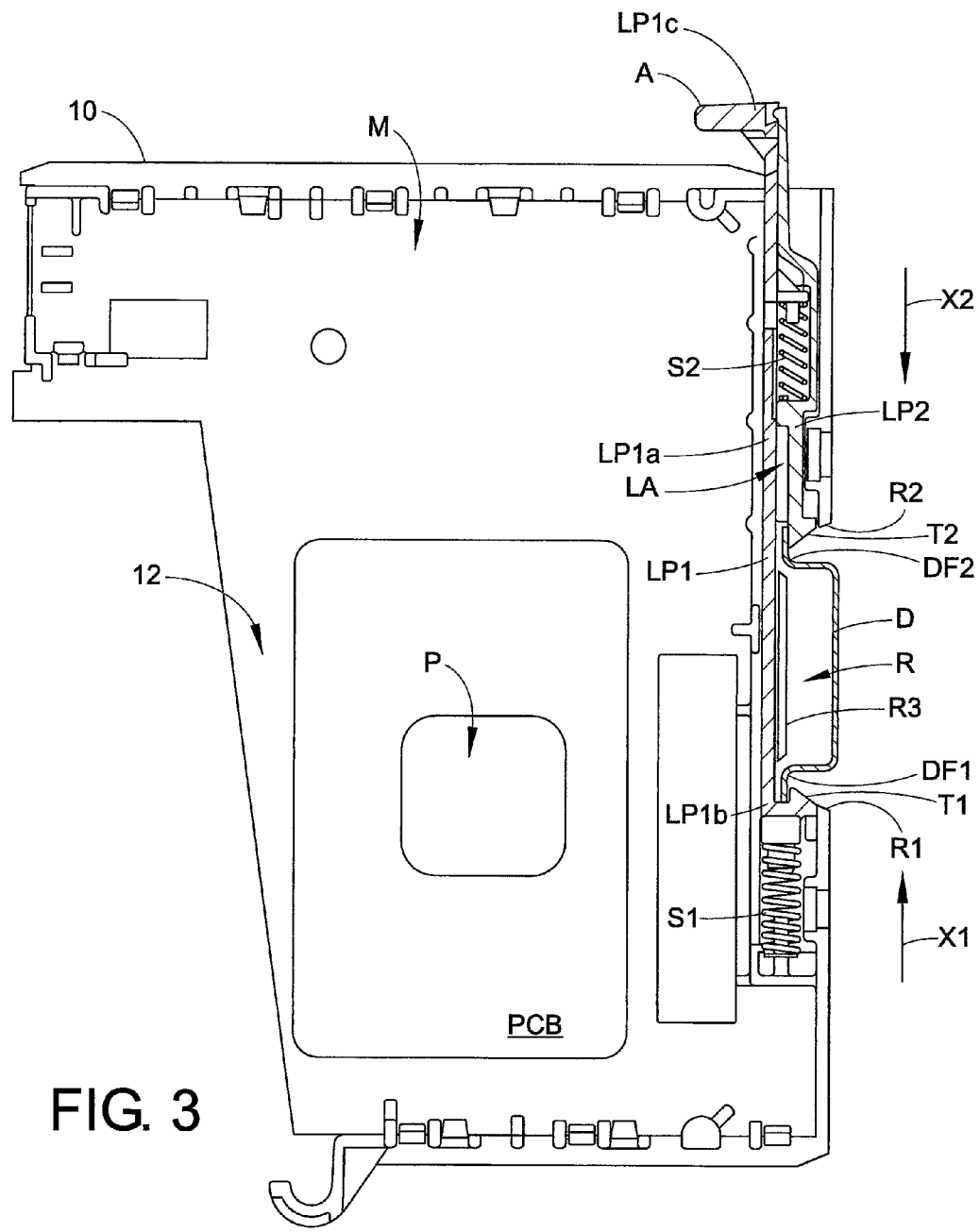
FIG. 3 is a simplified side section view of the module and DIN rail of FIG. 2, showing the latch system in its latched or locked configuration.
Figure 4:
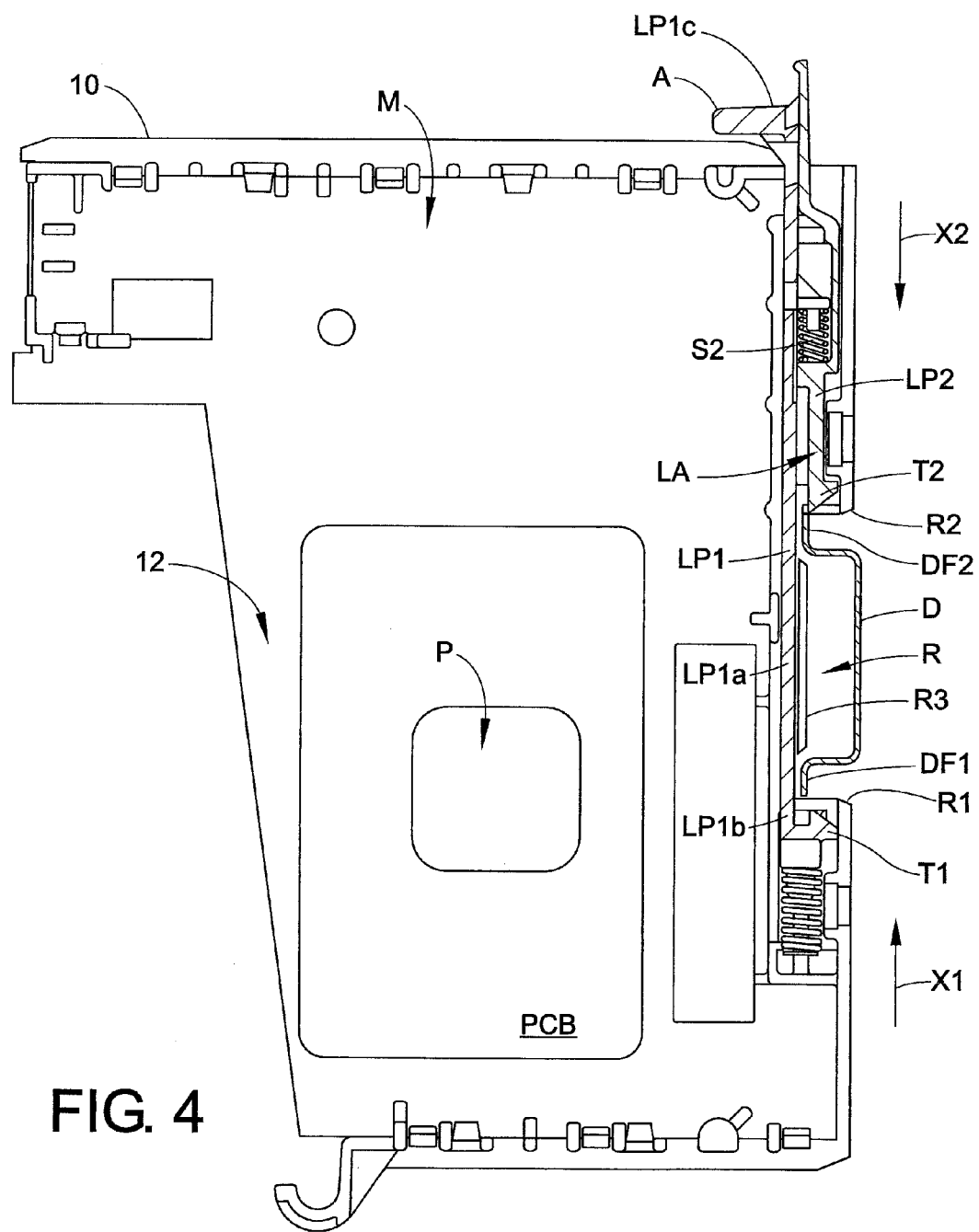
FIG. 4 is similar to FIG. 3, but shows the latch system in its unlatched or unlocked configuration.

FIG. 3 is a simplified side section view of the module M and DIN rail D, showing the latch system L in its latched or locked configuration, and FIG. 4 is similar to FIG. 3, but shows the latch system L in its unlatched or unlocked configuration. Referring to all of FIGS. 1-4, the electronics module M comprises a one-piece or multi-piece molded polymeric or metallic (e.g. formed, cast and/or extruded aluminum or other metal) housing 10 that defines an interior space 12 that receives and retains one or more electronic components such as one or more printed circuit boards PCB comprising a microprocessor P such as an ASIC or general purpose microprocessor and/or other electronic circuitry adapted and programmed to perform a desired electronic function. It is often desirable to secure the module M to an associated support structure such as a DIN rail or other support structure in an operative position as shown in FIGS. 2 and 3 and to selectively disengage and separate the module M from the DIN rail or other support structure, and the latch system L is provided for such purposes. To simplify the description, the associated support structure will be described herein as the illustrated DIN rail D, which comprises first and second longitudinally extending edges or flanges DF1,DF2 (FIG. 2), but other support structures are contemplated and are within the scope of the present development.

With continuing reference to FIGS. 1-4, the housing 10 of the module M comprises or defines a recess R in a rear face MR thereof, and the recess R is dimensioned to closely receive the DIN rail D therein as shown, with the first and second DIN rail flanges DF1,DF2 located respectively adjacent first (lower) and second (upper) opposite edges R1,R2 of the recess R, with minimal clearance space between the DIN rail edges DF1,DF2 and the recess edges R1,R2. The recess R is open on its opposite lateral left and right sides so that the DIN rail D extends through the recess, and the recess includes in inner wall R3.

The latch system L of the module M comprises a latch assembly LA comprising first and second latch members or latch portions LP1,LP2 that selectively engage the first and second DIN rail flanges DF1,DF2, respectively, for capturing and retaining the DIN rail flanges in the recess R for operative connection of the module M to the DIN rail D.

Referring now particularly to FIGS. 3 and 4, the first and second latch portions LP1,LP2 can be seen, along with other components of the latch assembly LA including a first spring S1 that is operatively engaged or associated with the first latch portion LP1 and a second spring S2 that is operatively engaged or associated with/between both the first and second latch portions LP1,LP2. The second spring S2 exerts biasing forces on the latch assembly LA that urges the first and second latch portions LP1,LP2 in opposite first and second directions X1,X2 toward their respective latched positions and, thus, urges the latch assembly LA toward its latched configuration (FIG. 3). The first spring S1 exerts a biasing force on the first latch portion LP1, at least when the first latch portion LP1 is located in its unlatched position and the latch assembly is in its unlatched state, that urges the latch assembly LA (both the first and second latch portions LP1,LP2) in the first direction X1 when and the latch assembly LA is arranged in its unlatched configuration to maintain the latch assembly LA in its required position relative to the housing 10. The first and second latch portions LP1,LP2 are selectively manually movable relative to each other against the biasing forces of the second spring S2 to place the latch assembly LA in its unlatched configuration (FIG. 4). When the latch assembly LA is located in its latched position, the first and second latch portions LP1,LP2 thereof are each located in respective latched positions, and when the latch assembly is located in its unlatched position, the first and second latch portions LP1,LP2 thereof are each located in respective unlatched positions.

With reference now also to FIGS. 5A-5C and 6, the first latch portion LP1 preferably comprises a one-piece molded polymeric structure that comprises an elongated linear main portion LP1a and an inner end LP1b located adjacent the first edge R1 of the recess R. The inner end LP1b of the first latch portion LP1 comprises a first locking tab T1 adapted to engage and retain the first DIN rail flange DF1 in the recess R. The main portion LP1a of the first latch portion LP1 extends adjacent the inner wall R3 of the recess R from its inner end LP1b to an outer end LP1c that is located external to the housing 10. The outer end LP1c includes or defines an actuator portion or actuator tab AT adapted to be engaged by a user's thumb or finger or otherwise manually engaged by a user to move the latch assembly LA from its latched to its unlatched configuration as described below. In the illustrated embodiment, the main portion LP1a of the first latch portion LP1 is exposed and at least partially defines the recess inner wall R3.

The second latch portion LP2 also preferably comprises a one-piece molded polymeric construction that comprises a main portion LP2a and an inner end LP2b located adjacent the second edge R2 of the recess R. The inner end LP2b of the second latch portion LP2 comprises a second locking tab T2 adapted to engage and retain the second DIN rail flange DF2 in the recess R. The main portion LP2a of the second latch portion LP2 lies adjacent and preferably slidably abuts the main portion LP1a of the first latch portion LP1. The second latch portion LP2 further comprises a flexible, resilient tail portion LP2t connected to the main portion LP2a and that extends to an outer end LP2c located external to the housing 10 and adjacent the outer end LP1c and actuator portion/tab AT of the first lock portion LP1. The resilient tail portion LP2t normally lies adjacent and abuts the first lock portion LP1, but the resilient tail portion LP2t is selectively deflectable away from the first lock portion LP1 in a deflection direction XD (see FIG. 5B) as required for the latch assembly LA to move between its latched and unlatched configurations.

The first and second locking tabs T1,T2 are located in respective extended positions and project into the recess R beyond the first and second recess edges R1,R2, respectively, when the latch assembly LA is located in its latched configuration as shown in FIG. 3 so that the first and second DIN rail flanges DF1,DF2 are respectively captured behind the first and second locking tabs T1,T2, i.e., between the first and second locking tabs T1,T2 and the inner wall R3 of the recess R. When the latch assembly LA is located in its unlatched configuration as shown in FIG. 4, the first and second locking tabs T1,T2 are located in respective retracted positions where they are retracted relative to the first and second recess edges R1,R2, respectively, so that the first and second locking tabs are flush with or recessed relative to the first and second recess edges R1,R2 so that the first and second DIN rail flanges DF1,DF2 are able to move freely out of (or into) the recess R without being obstructed by the locking tabs T1,T2. The first and second locking tabs T1,T2 are thus spaced apart from each other by a first distance Y1 when the latch assembly LA is located in its latched configuration (FIGS. 3 & 5A), and are spaced apart from each other by a second distance Y2 that is greater than the first distance Y1 (i.e., Y2>Y1) when the latch assembly LA is located in its unlatched configuration (FIGS. 4 & 5C).

The first spring S1 is operatively located between the inner end LP1b of the first lock portion LP1 and the housing 10. In the illustrated embodiment, the spring is maintained in a free or unloaded state when the latch assembly LA is arranged in its latched configuration or state, but it can also be partially compressed/loaded in this position of the latch assembly. In the illustrated example, the first spring S1 becomes loaded/compressed and biases the first latch portion LP1 (and also the second latch portion LP2 as described below) in the first direction X1 when the latch assembly LA is arranged in its unlatched configuration or state to ensure that the first and second latch portions LP1,LP2 are properly positioned relative to the housing 10 when the latch assembly LA is configured in its unlatched state. The second spring S2 is operatively located between the first and second latch portions LP1,LP2 and biases the second latch portion LP2 in a second direction X2 relative to the first latch portion toward its latched position such that the second locking tab T2 is biased toward its extended (latched) position, and the second spring S2 also biases the first latch portion LP1 in the first direction X1 relative to the second latch portion LP2.

Figures 5A, 5B, 5C:
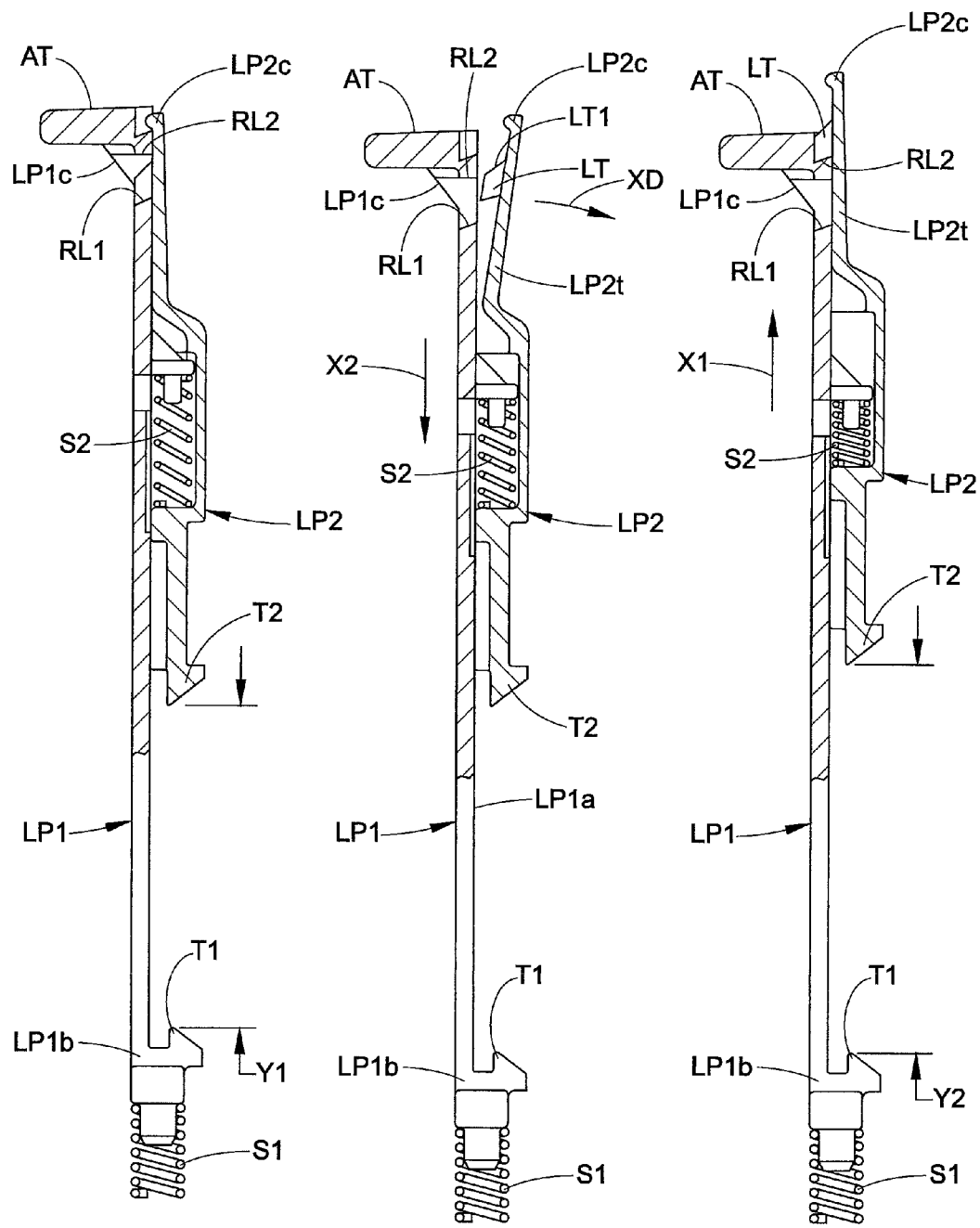
FIGS. 5A, 5B, and 5C are side section views of a latch assembly portion of the latch system of the module shown in FIGS. 1-4, with FIG. 5A showing the latch assembly in its latched configuration, FIG. 5C showing the latch assembly in its unlatched configuration, and FIG. 5B showing the latch assembly in an intermediate configuration between the latched and unlatched configurations.
Figure 6:
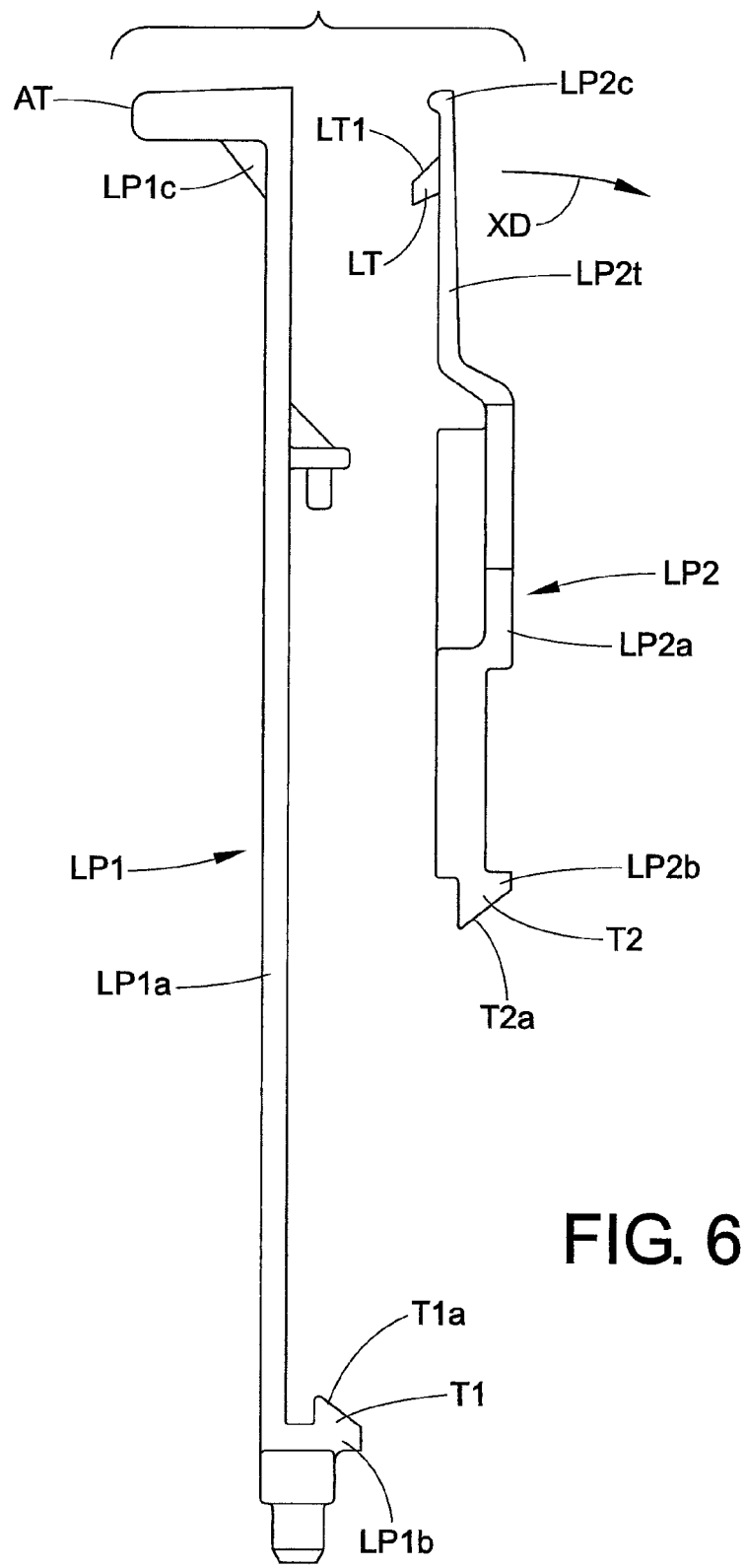
FIG. 6 provides an exploded side view of the first (primary) and second (secondary) latch portions or latch members of the latch assembly of FIGS. 5A-5C.
Figure 7:
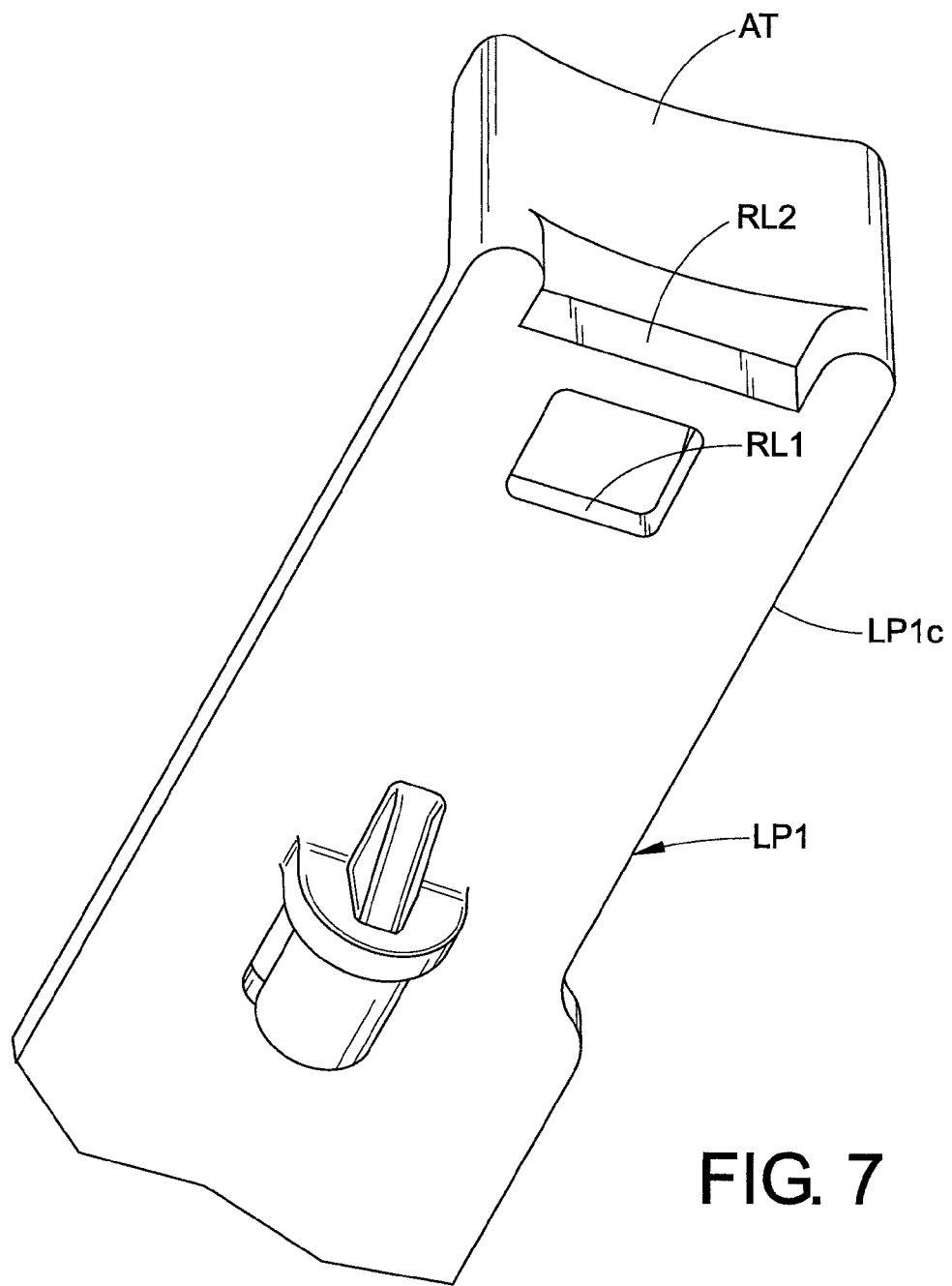
FIG. 7 is a greatly enlarged partial isometric view of an outer portion of the first/primary latch portion.

As shown in FIGS. 5A-5C, 6, and 7, the second latch portion LP2 comprises a locator tab LT that projects from the tail portion LP2t, and the main portion LP1a of the first latch portion LP1 comprises first and second spaced-apart apertures, recesses or other receiving locations RL1,RL2 (see also FIG. 7) that are adapted to receive and retain the locator tab LT. When the latch assembly LA is arranged in its latched configuration, the locator tab LT is located in the first receiving location RL1, and when the latch assembly LA is arranged in its unlatched configuration, the locator tab LT is located in the second receiving location RL1. The receiving location RL1,RL2 in which the locator tab LT is seated controls the distance (Y1,Y2) between the first and second locking tabs T1,T2. The locator tab LT is shaped to include a tapered outer surface LT1 oriented toward the outer end of the first latch portion LP1. Accordingly, relative sliding movement between the first and second latch portions LP1, LP2 that occurs when the latch assembly LA is in its latched state and the first latch portion LP1 moves in the second direction X2 while the second latch portion is constrained from moving in the second direction X2 due to contact with the housing 10 will cause the locator tab tapered surface LT1 to bear against the first latch portion LP1 and deflect the resilient tail portion LP2t away from the first latch portion LP1 in the deflection direction XD as shown in FIG. 5B such that the locator tab LT is withdrawn from and exits the first receiving location RL1. The locator tab LT will automatically seat in the second receiving location RL2 and the resilient tail portion LP2t will resiliently return to undeflected state when the second receiving location RL2 is registered with/moves into registration with the locator tab LT as shown in FIG. 5C.

When the locator tab LT is seated in the second receiving locations RL2 as shown in FIG. 5C, the locator tab LT prevents the second spring S2 from moving the second latch portion LP2 in the second direction relative to the first latch portion LP1, but ensures that the second latch portion LP2 will move together with the first latch portion LP1 in the first direction X1 under the force of the first biasing spring S1. However, engagement between the second latch portion LP2 and the housing 10 prevents both of the first and second latch portions LP1,LP2 from moving in the first direction X1 under the biasing force of the first spring S1 beyond a desired distance, so that the latch assembly LA is restrained or maintained in its unlatched configuration and position once the locator tab LT seats in the second receiving location and the first and second latch portions LP1,LP2 move in the first direction X1 until the second latch portion LP2 abuts the housing 10. In particular, when the locator tab LT is seated in the second receiving location RL2 (latch assembly LA unlatched), the first and second latch portions LP1,LP2 are allowed to move as a unit in the first direction X1 under the force f the first spring S1 until the second bite tooth T2 is moved to its retracted position relative to the second edge R2 of the recess R, but the first and second latch portions LP1,LP2 are prevented from moving in the first direction X1 beyond such retracted location of the second bite tooth T2 to ensure that the first bite tooth T1 is also located in its retracted position relative to the first edge R1 of the recess R.

When the locator tab LT is seated in the first receiving location RL1 (latch assembly LA latched), the locator tab LT prevents movement of the first and second latch portions LP1,LP2 relative to each other in respective first and second directions X1,X2 as would decrease the distance Y1, and the latch portions LP1,LP2 are properly located in their latched positions relative to the housing 10 by engagement of the first and/or second latch portions LP1,LP2 with the housing 10.

Figure 8:
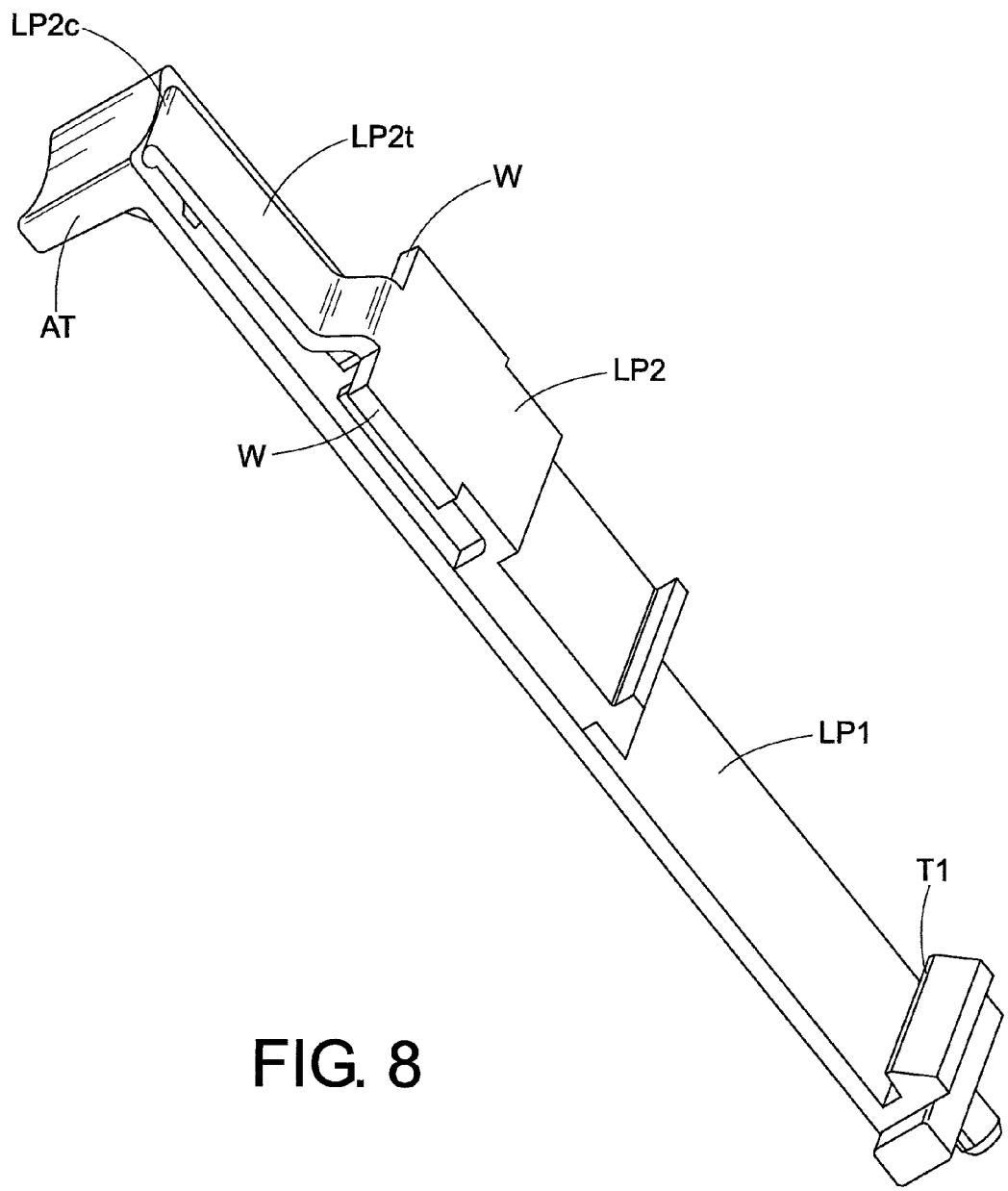
FIG. 8 is an enlarged isometric view of the first and second latch portions operatively connected together in their latched configuration.
Figure 9:
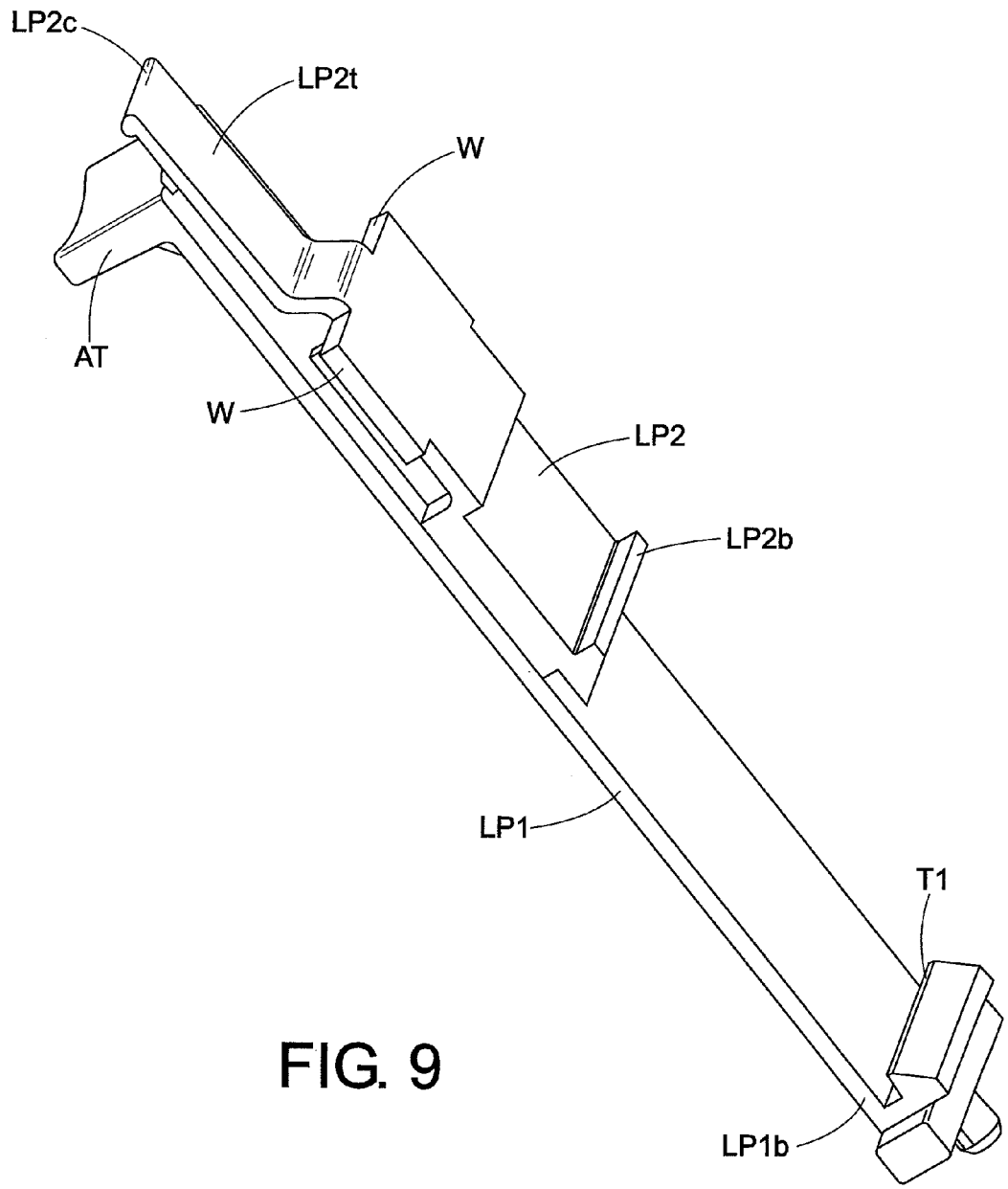
FIG. 9 is an enlarged isometric view of the first and second latch portions operatively connected together and located in their in their unlatched configuration.

FIGS. 8 and 9 respectively show the first and second latch portions LP1,LP2 in their latched and unlatched positions, and it can be seen that the second latch portion LP2 comprises at least one wing W (two wings W are shown in the illustrated embodiment) adapted to abut the module housing 10 to limit or constrain movement of the second latch portion LP2 in the second direction X2 under force of the second spring S2, and to limit movement of both the first and second latch portions LP1,LP2 in the first direction X1 when they are located in their latched and unlatched positions. Likewise, the first latch portion LP1 includes one or more structures such as wings W2 that constrain movement of the first latch portion LP1 in the first and second directions X1,X2.

The first and second locking tabs T1,T2 each comprise a tapered outer surface T1a,T2a (FIG. 6) that diverges as it extends away from the recess inner wall R3 such that upon abutment of a DIN rail flange DF1,DF2 therewith, the first latch portion LP1 will be moved linearly in the second direction X2 relative to the housing 10 and relative to the second latch portion LP2 against the biasing force of the second spring S2, and the second latch portion LP2 will be moved linearly in the first direction X1 relative to the housing 10 and relative to the first latch portion LP1 against the biasing force of the second spring S2 so that the DIN rail D is received in the module recess R even when the latch assembly LA is arranged in its latched configuration, i.e., the module M can be mounted on the DIN rail even when the latched assembly is positioned in its latched configuration. It should be noted that movement of the second latch portion LP2 in the first direction X1 relative to the first latch portion LP1 is allowed due to the tapered surface LT1 of the locator tab LT and due to the fact that the resilient tail portion LP2t is able to deflect in the deflection direction XD so that the locator tab LT moves at least partially or completely out of the first receiving location RL1. Once the DIN rail flanges move into the recess past the locking tabs T1,T2, the latch portions LP1,LP2 will return to their latched positions under force of the second spring S2 to capture the DIN rail in the recess R. Also, the locking tabs T1,T2 are dimensioned such that the movement of the first and second latch portions LP1,LP2 relative to each other in the respective second and first directions is not of sufficient magnitude to cause the second receiving location RL2 to move into registration with the locator tab LT as would cause the first and second latch portions LP1,LP2 to become engaged with each other in the unlatched configuration.

In use, the latch assembly LA is moved from its latched configuration (FIGS. 3 & 5A) to its unlatched configuration (FIGS. 4 & 5C) upon a user's manual movement of the first latch portion LP1 linearly in the second direction X2 by depressing the actuator tab AT (FIG. 5B). When the first latch portion is fully depressed, the locator tab LT will move from the first receiving location RL1 (FIG. 5A) into the second receiving location, and the latch assembly LA will settle and remain locked in its unlatched configuration when the user's manual pressure is released from the actuator tab AT, and the first spring S1 will move both the first and second latch portions LP1,LP2 as a unit relative to the housing 10 in the first direction X1 to their proper unlatched location. This unlatched state can be useful if a module M includes multiple latch assemblies LA that need to be maintained in an unlatched state to separate the module M from a DIN rail D. When the user desires to reset the latch assembly LA from its unlatched condition (FIG. 5C) to its latched configuration (FIG. 5A), the user manually deflects or moves the resilient tail portion LP2t of the second latch portion LP2 in the deflection direction XD until the locator tab LT exits the second receiving location RL1, at which time the second spring S2 will move the second latch portion LP2 in the second direction X2 relative to the first latch portion LP1 and/or the second spring S2 will move the first latch portion LP1 in the first direction X1 relative to the second latch portion LP2 until the locator tab LT again seats in the first receiving location RL1 so that the first and second latch portions LP1,LP2 are located in their respective latched positions as shown in FIG. 5A.

The present development thus provides and electronics module including a latch system that allows for one-handed operation/single-point actuation, does not require a screwdriver or other tool to operate, utilizes linear movement for latching rather than pivoting or rotational movement, provides positive tactile feedback when moving between its latched and unlatched configurations, is able to be locked in an open or unlatched configuration, and that is more convenient and effective that known latch assemblies.

In the preceding specification, various embodiments have been described with reference to the accompanying drawings. It will, however, be evident that various modifications and changes may be made thereto, and additional embodiments may be implemented, without departing from the broader scope of the invention as set forth in the claims that follow. The specification and drawings are accordingly to be regarded in an illustrative rather than restrictive sense.

The following is claimed:

1. An electronics module comprising:
   a housing including a rear face comprising a recess adapted to receive an associated mounting rail, said recess comprising first and second opposite edges;
   a latch assembly connected to said housing and adapted for selectively releasably securing said housing an associated mounting rail located in said recess, said latch assembly comprising:
   a first latch portion movably connected to said housing and comprising a locking tab adapted to capture a first associated DIN rail flange in said recess;
   a second latch portion movably connected to said housing adjacent said first latch portion and comprising a second locking tab adapted to capture a second associated DIN rail flange in said recess;
   said first and second latch portions linearly movable relative to each other to and between: (i) a latched configuration where said first and second latch portions are located in respective latched positions in which said first and second locking tabs project respectively beyond said first and second opposite edges of said recess and partially obstruct said recess; and (ii) an unlatched configuration where said first and second latch portions are located in respective unlatched positions in which said first and second locking tabs are spaced farther apart from each other as compared to the latched configuration;

first and second springs, wherein said first spring exerts a biasing force on said first latch portion that urges both said first and second latch portions in a first direction relative to said housing when said first and second latch portions are located in said unlatched configuration, and wherein said second spring exerts a biasing force that urges said first latch portion in said first direction and urges said second latch portion in a second direction that is opposite said first direction.

2. The electronics module as set forth in claim 1, wherein said second spring is operatively engaged between said first and second latch portions.

3. The electronics module as set forth in claim 2, wherein:
said first latch portion comprises an actuation portion located external to said housing and adapted to be manually engaged to move said first latch portion in said second direction from its latched position toward its unlatched position; and,
said second latch portion comprises a resilient tail portion that lies adjacent said first latch portion and that comprises a locator tab that engages a first receiving location of said first latch portion when said first and second latch portions are located in their respective latched positions, and that engages a second receiving location of said first latch portion when said first and second latch portions are located in their respective unlatched positions.

4. The electronics module as set forth in claim 3, wherein:
said first latch portion is selectively manually movable in said second direction from its latched position toward its unlatched position such that said first latch portion slides relative to said second latch portion, said resilient tail is deflected in a deflection direction in response to contact between said locator tab and said first latch portion, and said locator tab moves from said first receiving location to said second receiving location when said locator tab moves into registration with said second receiving location;
engagement of said locator tab with said second receiving location couples said second latch portion to said first latch portion for movement in said first direction under force of said first spring such that said second latch portion moves with said first latch portion in said first direction to its unlatched position when said first spring moves said first latch portion in said first direction; and
engagement of said second latch portion with said housing limits movement of said first and second latch portions in said first direction when said locator tab is located in said second receiving location.

5. The electronics module as set forth in claim 4, wherein said resilient tail is selectively manually deflectable to withdraw said locator tab from said second receiving location when said first and second latch portions are located in said latched configuration, wherein said second spring moves said first latch portion in said first direction to said latched position of said first latch portion when said locator tab is withdrawn from said second receiving location.

6. The electronics module as set forth in claim 5, wherein said first and second latch portions are movable relative to each other against said second biasing force of said second spring in said second and first directions toward their unlatched positions, respectively, to allow the associated mounting rail to move into said recess when said first and second latch portions are arranged in their latched configuration.

7. The electronics module as set forth in claim 6, wherein said locator tab comprises a tapered outer surface oriented toward the actuation portion of the first latch portion and that extends away from said actuation portion as it extends away from said second latch portion, wherein said tapered outer surface contacts said first latch portion upon movement of said first latch portion relative to said second latch portion in said second direction such that said resilient tail portion is deflected in said deflection direction and said locator tab is at least partially withdrawn from said first receiving location.

8. An electronics module comprising:
a housing including a rear face comprising a recess, said recess comprising first and second opposite edges and an inner region;
a latch assembly connected to said housing and adapted for selectively releasably securing said housing an associated mounting rail located in said recess, said latch assembly comprising:
a first latch portion movably connected to said housing and comprising a locking tab adapted to capture a first flange of the associated mounting rail in said recess;
a second latch portion movably connected to said housing and slidably abutted with said first latch portion, said second latch portion comprising a second locking tab adapted to capture a second flange of the associated mounting rail in said recess;
said first and second latch portions movable relative to each other to and between: (i) a latched configuration of said latch assembly in which said first and second latch portions are located in respective latched positions and said first and second locking tabs are spaced apart from each other by a first distance Y1 and project respectively beyond said first and second opposite edges of said recess and partially obstruct said recess; and (ii) an unlatched configuration of said latch assembly in which said first and second latch portions are located in respective unlatched positions and said first and second locking tabs are spaced apart from each other by a second distance Y2, wherein Y2>Y1;
first and second springs, wherein said first spring is operatively located between said housing and said latch assembly and biases said first latch portion in a first direction when said latch assembly is arranged in said unlatched configuration, and wherein said second spring is operatively located between said first and second latch portions and biases said first latch portion in said first direction and biases said second latch portion in a second direction opposite the first direction;
said first latch portion comprising an actuation portion that projects externally from said housing and that is adapted to be manually engaged and moved linearly to move said first latch portion from its latched position toward its unlatched position.

9. The electronics module as set forth in claim 8, wherein said second latch portion comprising a resilient tail portion that lies adjacent said first latch portion and that comprises a locator tab that engages a first receiving location of said first latch portion when said first and second latch portions are located in their respective latched positions, and that engages a second receiving location of said first latch portion when said first and second latch portions are located in their respective unlatched positions.

10. The electronics module as set forth in claim 9, wherein said second latch portion is constrained from moving together with said first latch portion in said second direction when said actuation portion moved linearly in said second direction to move said first latch portion from its latched position toward its unlatched position, and wherein said resilient tail portion of said second latch portion deflects away from said first latch portion in a deflection direction to allow said locator tab to exit said first receiving location to allow linear movement of said first latch portion relative to said second latch portion when said actuation portion moved linearly in said second direction to move said first latch portion from its latched position toward its unlatched position.

11. The electronics module as set forth in claim 10, wherein:
   said locator tab of said second latch portion moves from said first receiving location to said second receiving location when said actuation portion is engaged to move said first latch portion in said second direction relative to said second latch portion, and;
   engagement of said locator tab with said second receiving location couples said second latch portion to said first latch portion for movement with said first latch portion in said first direction when said actuator portion is released and said first spring moves said first latch portion in said first direction to its unlatched position.

12. The electronics module as set forth in claim 11, wherein engagement of said second latch portion with said housing limits movement of said first and second latch portions in said first direction under force of said first spring when said locator tab is located in said second receiving location such that said latch assembly is located in said unlatched configuration.

13. The electronics module as set forth in claim 12, wherein said resilient tail comprises an outer end located external to said housing, said resilient tail selectively manually movable in said deflection direction when said latch assembly is arranged in said unlatched configuration to move said locator tab out of said second receiving location such that said second spring moves said first latch portion in said first direction relative to said second latch portion to the latched position of said first latch portion.

14. The electronics module as set forth in claim 13, wherein said locator tab comprises a tapered outer surface oriented toward the actuation portion of the first latch portion and that extends away from said actuation portion as it extends away from said second latch portion, wherein said tapered outer surface is engaged by said first latch portion upon movement of said first latch portion relative to said second latch portion in said second direction such that said resilient tail portion is deflected in said deflection direction.

15. The electronics module as set forth in claim 14, wherein said first and second locking tabs comprise respective tapered surfaces that diverge away from each other as they extend away from said inner region of said recess such that said first and second latch portions are moved in said second and first directions, respectively, when said first and second locking tabs are contacted by the first and second flanges of the associated mounting rail upon insertion of the associated mounting rail into the recess when said latch assembly is arranged in its latched configuration.

16. An electronics module comprising:
   a housing including a rear face comprising a recess, said recess comprising first and second opposite edges and an inner region;
   a latch assembly connected to said housing and adapted for selectively releasably securing said housing an associated mounting rail located in said recess, said latch assembly comprising:
   a first latch portion comprising a locking tab adapted to capture a first flange of the associated mounting rail in said recess;
   a second latch portion slidably abutted with said first latch portion, said second latch portion comprising a second locking tab adapted to capture a second flange of the associated mounting rail in said recess;
   said first and second latch portions linearly movable relative to each other between: (i) a latched configuration of said latch assembly in which said first and second latch portions are located in respective latched positions and said first and second locking tabs are spaced apart from each other by a first distance Y1 and project respectively beyond said first and second opposite edges of said recess and partially obstruct said recess; and (ii) an unlatched configuration of said latch assembly in which said first and second latch portions are located in respective unlatched positions and said first and second locking tabs are spaced apart from each other by a second distance Y2, wherein Y2>Y1;
   a spring operatively located between said first and second latch portions that biases said first latch portion in a first direction and that biases said second latch portion in a second direction opposite the first direction;
   said first latch portion comprising an actuation portion located externally from said housing and that is adapted to be manually engaged and moved linearly in said second direction to move said first latch portion from its latched position toward its unlatched position;
   said second latch portion comprising a resilient tail portion that lies adjacent said first latch portion and that comprises a locator tab that engages a first receiving location of said first latch portion when said first and second latch portions are located in their respective latched positions, and that engages a second receiving location of said first latch portion when said first and second latch portions are located in their respective unlatched positions.

17. The electronics module as set forth in claim 16, wherein said resilient tail portion deflects away from said first latch portion in a deflection direction and said locator tab exits said first receiving location when said latch assembly is arranged in said latched configuration and said first latch portion is moved relative to said second latch portion in said second direction in response to contact between said first latch portion and said locator tab that urges said resilient tail portion in said deflection direction.

* * * * *